(12) United States Patent
Grujicic et al.

(10) Patent No.: US 11,291,122 B2
(45) Date of Patent: Mar. 29, 2022

(54) APPARATUS WITH A SUBSTRATE PROVIDED WITH PLASMA TREATMENT

(71) Applicant: Intel Corporation, Santa Clara, CA (US)

(72) Inventors: Darko Grujicic, Chandler, AZ (US); Rengarajan Shanmugam, Chandler, AZ (US); Sandeep Gaan, Phoenix, AZ (US); Adrian Bayraktaroglu, Chandler, AZ (US); Roy Dittler, Chandler, AZ (US); Ke Liu, Chandler, AZ (US); Suddhasattwa Nad, Chandler, AZ (US); Marcel A. Wall, Chandler, AZ (US); Rahul N. Manepalli, Chandler, AZ (US); Ravindra V. Tanikella, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 16/637,545

(22) PCT Filed: Sep. 22, 2017

(86) PCT No.: PCT/US2017/053068
§ 371 (c)(1),
(2) Date: Feb. 7, 2020

(87) PCT Pub. No.: WO2019/059933
PCT Pub. Date: Mar. 28, 2019

(65) Prior Publication Data
US 2020/0245472 A1 Jul. 30, 2020

(51) Int. Cl.
*C23C 18/38* (2006.01)
*H05K 3/38* (2006.01)
*C23C 18/16* (2006.01)
*C23C 18/18* (2006.01)
*H01L 21/48* (2006.01)
(Continued)

(52) U.S. Cl.
CPC ......... *H05K 3/381* (2013.01); *C23C 18/1653* (2013.01); *C23C 18/1851* (2013.01);
(Continued)

(58) Field of Classification Search
CPC .......... H05K 3/381; H05K 1/11; H05K 3/422; H05K 3/4661; H05K 2201/09509;
(Continued)

(56) References Cited

U.S. PATENT DOCUMENTS

| 4,568,562 A | 2/1986 | Phillips |
| 2005/0121327 A1 | 6/2005 | Chen et al. |

(Continued)

OTHER PUBLICATIONS

International Patent Office—International Search Report and Written Opinion dated Jun. 21, 2018, from International Application No. PCT/US2017/053068, 12 pages.

*Primary Examiner* — Steven T Sawyer
(74) *Attorney, Agent, or Firm* — Schwabe, Williamson & Wyatt, P.C.

(57) ABSTRACT

Embodiments of the present disclosure describe techniques for providing an apparatus with a substrate provided with plasma treatment. In some instances, the apparatus may include a substrate with a surface that comprises a metal layer to provide signal routing in the apparatus. The metal layer may be provided in response to a plasma treatment of the surface with a functional group containing a gas (e.g., nitrogen-based gas), to provide absorption of a transition metal catalyst into the surface, and subsequent electroless plating of the surface with a metal. The transition metal catalyst is to enhance electroless plating of the surface with the metal. Other embodiments may be described and/or claimed.

14 Claims, 5 Drawing Sheets

(51) Int. Cl.
  *H05K 3/42* (2006.01)
  *H05K 3/46* (2006.01)
  *H05K 1/11* (2006.01)
  *H01L 23/14* (2006.01)

(52) U.S. Cl.
  CPC .......... *C23C 18/38* (2013.01); *H01L 21/4857* (2013.01); *H01L 23/145* (2013.01); *H05K 1/11* (2013.01); *H05K 3/422* (2013.01); *H05K 3/4661* (2013.01); *H05K 2201/09509* (2013.01)

(58) Field of Classification Search
  CPC ................... H05K 3/181; H05K 3/383; H05K 2203/1407; H05K 2203/1423; H05K 2203/0789; H05K 2203/095; H01L 23/145; H01L 21/4857; C23C 18/1653; C23C 18/1851; C23C 18/38; C23C 18/1893
  See application file for complete search history.

(56) References Cited

U.S. PATENT DOCUMENTS

| | | | |
|---|---|---|---|
| 2005/0230259 A1* | 10/2005 | Fares-Karam | H05K 3/182 205/86 |
| 2007/0059449 A1 | 3/2007 | Ryu et al. | |
| 2008/0175986 A1* | 7/2008 | Crouse | C23C 18/285 427/154 |
| 2009/0050600 A1 | 2/2009 | Yeh et al. | |
| 2011/0051387 A1 | 3/2011 | Tachibana et al. | |

\* cited by examiner

APPARATUS WITH A SUBSTRATE PROVIDED WITH PLASMA TREATMENT

CROSS REFERENCE TO RELATED APPLICATIONS

The present application is a national phase entry under 35 U.S.C. § 371 of International Application No. PCT/US2017/053068, filed Sep. 22, 2017, entitled "AN APPARATUS WITH A SUBSTRATE PROVIDED WITH PLASMA TREATMENT", which designated, among the various States, the United States of America. The disclosure of International Application No. PCT/US2017/053068 is hereby incorporated by reference in its entirety.

FIELD

Embodiments of the present disclosure generally relate to the field of semiconductor package and printed circuit board (PCB) fabrication and in particular to techniques for improving surfaces of substrates used in semiconductor packages or PCB.

BACKGROUND

Electroless deposition is routinely employed in electronic industry to form a seed layer in substrates that could be utilized to form metallic interconnects on buildup films/composite polymeric materials. Buildup films in semiconductor packaging typically include epoxy resins, surface finish films, molding compounds, photo imageable dielectrics, and other types of organic films. Achieving uniform surface coverage for various substrate materials is crucial and may be particularly challenging with polymeric composite materials that do not provide sufficiently active surface sites that favor electroless plating reactions through the complex physicochemical interactions.

Electroless metal (e.g., copper) is deposited as a seed layer on top of the film in order to provide conductive layer for electrolytic plating of copper or other metals. In order to prevent uneven current distribution during electrolytic plating, the seed layer needs to have a uniform sheet resistance, which in turn means that the seed layer thickness needs to be uniform.

Electroless deposition involves reduction of metallic ions in solution onto insulating or conducting surfaces through electron transfer reactions with a reductant in liquid phase. These redox reactions are particularly enhanced by transition metal catalysts typically loaded onto substrates and meant for plating. These catalysts significantly improve the heterogeneous reaction rate by facilitating the oxidation of reductant species. Also, electroless plating solutions incorporate various complexing and/or stabilizing agents that help minimize homogeneous reaction and prevent spontaneous metal plate-out.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure include techniques and configurations for providing an apparatus with a substrate provided with plasma treatment. In some embodiments, the apparatus may include a substrate with a surface that comprises a metal layer to provide signal routing in the apparatus. The metal layer may be provided in response to a plasma treatment of the surface with a functional group containing a gas (e.g., nitrogen-based gas), to provide absorption of a transition metal catalyst into the surface, and subsequent electroless plating of the surface with a metal. The transition metal catalyst is to enhance electroless plating of the surface with the metal.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
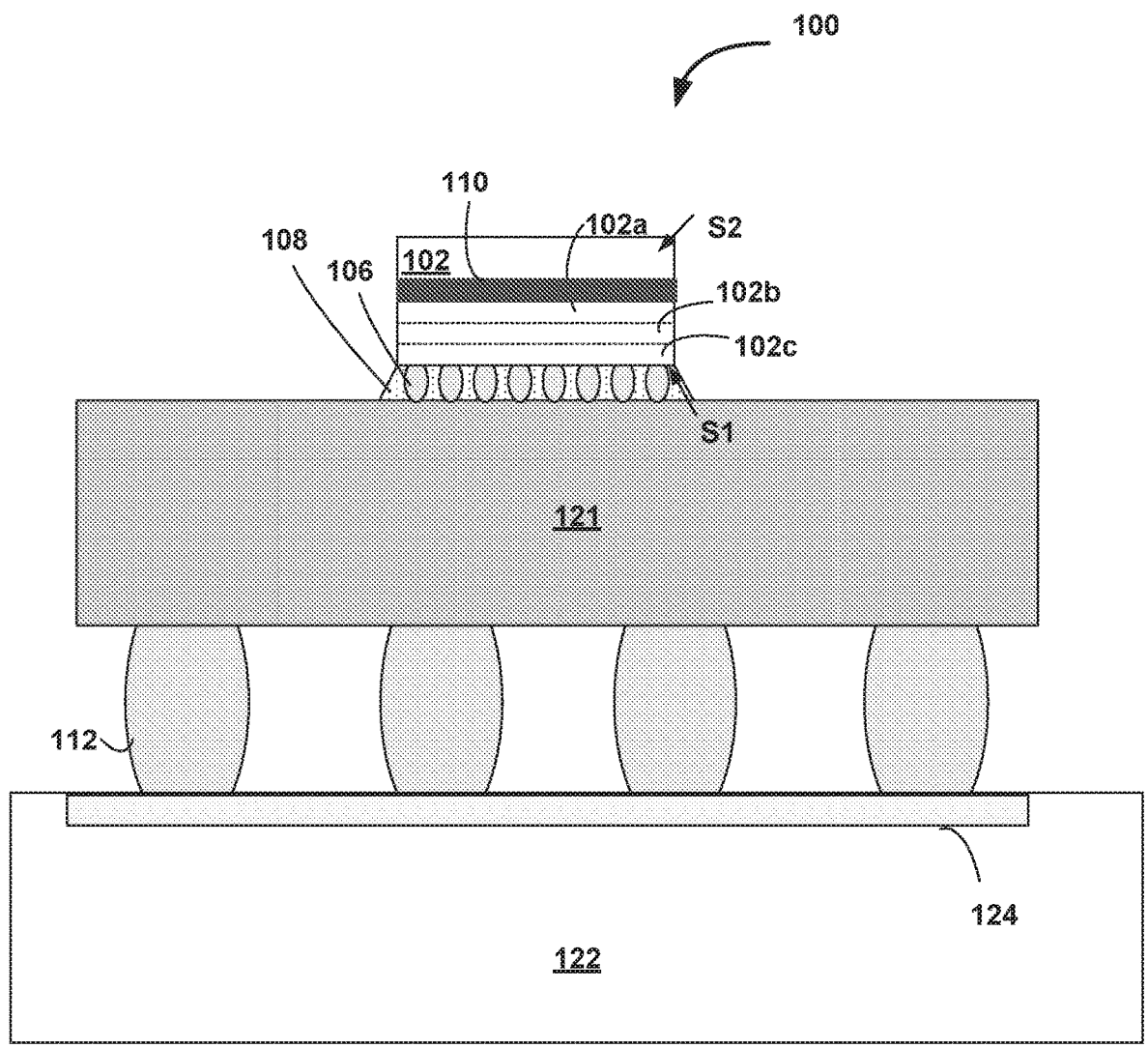
FIG. 1 illustrates a cross-section side view of an example integrated circuit (IC) assembly comprising a semiconductor device, in accordance with some embodiments.

FIG. 1 illustrates a cross-section side view of an example integrated circuit (IC) assembly comprising a semiconductor device, in accordance with some embodiments. In some embodiments, the IC assembly 100 may comprise a semiconductor package device, for example an integrated circuit (IC), such as a central processing unit (CPU) or a memory unit, and may further comprise a portion of a computing device, such as a graphics device, wireless device, multi-chip package including a combination with other devices, or the like.

In some embodiments, the IC assembly 100 may include one or more dies (hereinafter "die 102") electrically and/or physically coupled with a package assembly 121 (sometimes referred to as a "package substrate"). In some embodiments, the package assembly 121 may be electrically coupled with a circuit board 122.

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a radio frequency (RF) die. In other embodiments, the die may be, include, or be a part of a processor, memory, system-on-chip (SoC), SiP, or ASIC.

In some embodiments, an underfill material 108 (sometimes referred to as an "encapsulant") may be disposed between the die 102 and the package assembly 121 to promote adhesion and/or protect features of the die 102 and the package assembly 121. The underfill material 108 may be composed of an electrically insulative material and may encapsulate at least a portion of the die 102 and/or the die-level interconnect structures 106. In some embodiments, the underfill material 108 may be in direct contact with the die-level interconnect structures 106.

The die 102 can be attached to the package assembly 121 according to a wide variety of suitable configurations including, for example, being directly coupled with the package assembly 121 in a flip-chip configuration, as depicted. In the flip-chip configuration, an active side, S1, of the die 102 including active circuitry is attached to a surface of the package assembly 121 using die-level interconnect structures 106 such as bumps, pillars, or other suitable structures that may also electrically couple the die 102 with the package assembly 121. The active side S1 of the die 102 may include transistor devices, and an inactive side, S2, may be disposed opposite to the active side S1.

The die 102 may generally include a semiconductor substrate 102a, one or more device layers (hereinafter "device layer 102b"), and one or more interconnect layers (hereinafter "interconnect layer 102c"). The semiconductor substrate 102a may be substantially composed of a bulk semiconductor material such as, for example, silicon, in some embodiments.

The device layer 102b may represent a region where active devices such as transistor devices are formed on the semiconductor substrate 102a. The device layer 102b may include, for example, structures such as channel bodies and/or source/drain regions of transistor devices. The interconnect layer 102c may include interconnect structures that are configured to route electrical signals to or from the active devices in the device layer 102b. For example, the interconnect layer 102c may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

In some embodiments, the package assembly 121 may include a multi-layer package assembly with integrated components for wireless communication. The wireless communication may include, for example, short range wireless data transfer between portable devices and/or wireless displays or high speed wireless communication between peer devices.

The package assembly 121 may include electrical routing features (not shown in FIG. 1) such as, for example, traces, pads, through-holes, vias, or lines configured to route electrical signals to or from the die 102. For example, the package assembly 121 may be configured to route electrical signals between the die 102 and components for wireless communication that are integrated within the package assembly, or between the die 102 and the circuit board 122, or between the die 102 and another electrical component (e.g., another die, interposer, interface, component for wireless communication, etc.) coupled with the package assembly 121. For example, in some embodiments, the semiconductor substrate 102a (or the substrate comprising the package assembly 121) may include a surface 110 provided with plasma treatment to form a metal layer for signal routing for the IC assembly 100 according to various embodiments described herein.

The circuit board 122 may be a printed circuit board (PCB) composed of an electrically insulative material such as an epoxy laminate. For example, the circuit board 122 may include electrically insulating layers composed of materials, such as polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin prepreg material. Interconnect structures (not shown) such as traces, trenches or vias may be formed through the electrically insulating layers to route the electrical signals of the die 102 through the circuit board 122. The circuit board 122 may be composed of other suitable materials in other embodiments. In some embodiments, the circuit board 122 may be a motherboard or other PCB in a computing device (e.g., described in reference to FIG. 5).

Package-level interconnects, such as solder balls 112, may be coupled with the package assembly 121 and/or the circuit board 122 to form corresponding solder joints that are configured to further route the electrical signals between the package assembly 121 and the circuit board 122.

In some embodiments, the circuit board 122 may include a substrate 124 with a surface formed with plasma treatment in accordance with embodiments described herein. Other suitable techniques to physically and/or electrically couple the package assembly 121 with the circuit board 122 may be used in other embodiments.

The IC assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC package assembly 100 may be used in some embodiments.

The embodiments described herein provide for using plasma treatment in formation of a metal layer on a surface on a substrate (e.g., organic substrate) of a semiconductor device or a PCB. The metal (e.g., copper) layer may serve to provide interconnects for signal routing in the semiconductor device or PCB.

When organic substrates (e.g., resin films) used in semiconductor packaging go through electroless metal layer (e.g., copper) plating step, their surface may have a range of different surface groups, whose nature and relative fraction may depend on the type of pre-treatment used. In general, these can be acetyl and hydroxyl groups, aromatic and aliphatic esters, epoxides, etc. These surface groups essentially bind on the surface of the carbon-carbon resin backbone. Certain resins may inherently possess functional groups, such as ketone, carboxyl, etc. from their monomeric parents, making them hydrophilic and fairly suitable for wet processing. However, relatively simple oxygen based functional groups on the surface may not have strong affinity to bind/chemically co-ordinate with ionic or colloidal palladium (Pd2+) transition metal species. This may become a concern for electroless plating processes employing ionic catalysts. Resin affinity towards catalyst may become fairly low and result in reduced catalyst loading and lower catalytic sites for subsequent electroless reactions. The described embodiments provide techniques for addressing electroless coverage without modifying the underlying chemical additives.

The described embodiments provide for substantially improved (e.g., substantially uniform) substrate surface coverage with a metal layer, compared with conventional solutions. More specifically, the described embodiments enable continuous electroless copper deposition on highly cross-linked resin or polymeric substrates (such as solder resist, molding compound, photo-imageable dielectrics, etc.) by chemically functionalizing the surface with catalyst gas (e.g., nitrogen) related functional groups that promote adsorption of ionic transition metal catalyst species, including ionic or colloidal palladium (Pd). The higher affinity of the polymeric composites towards the transition metal species may result in improved catalytic activity for electroless reactions and substantially uniform surface coverage needed for downstream electroplating processes for building up interconnects.

Conventional solutions may include surface roughening to provide higher mechanical interlocking sites for the catalyst, and functionalization in conditioner solutions. Conventional approaches may be limited by the extent to which underlying substrates can be roughened as skin effect electrical losses start dominating for surfaces with large topographical differences. Further, conventional approaches may focus mostly on improving coverage on inorganic filler materials, such as silica, and not the resin phase, and therefore may not provide an efficient substrate surface coverage improvement.

The embodiments described herein provide for functionalization of the resin and creation of favorable conditions for ionic transition metal adsorption, including Pd species commonly used in electroless copper deposition. This pretreatment procedure may provide uniform electroless seed layer on smooth resins/polymeric composite substrates that are of particular interest for electronic interconnects with lesser skin effects by augmenting with conventional mechanical interlocking principle.

In embodiments, specific functional groups containing catalyst gas (e.g., nitrogen) may be chemically bonded on the substrate surface of composite resin matrix (typically, epoxy based), using plasma pretreatment with constituent gases or gas mixtures of interest (e.g., containing nitrogen). Under plasma conditions, ions and free radicals generated from the constituent gases or gas mixtures may interact with carbon backbone in the polymeric resin, resulting in the formation of nitrogen surface functional groups. These nitrogen surface functional groups may possess electron lone pairs that provide favorable attractive physicochemical interactions with transition metal ions during electroless pretreatment. High affinity of the resin towards transition metal catalyst may create initial seeding sites for electroless copper plating and subsequent in-plane 2D growth on the substrate. Favorable nucleation and catalysis characteristics may result in continuous copper film coverage even on composite resins that otherwise may not be amenable for copper nucleation by conventional electroless deposition techniques without pre-activation procedure according to embodiments described herein.

The mechanism of electroless copper growth is based on reduction of copper ions on the surface by a reducing agent on a catalytic site. These catalytic sites are transition metal nuclei typically embedded on the surface of the substrates or films that require metal (copper) seeding. In the initial stage of electroless copper deposition, copper ions from the plating solution can only be reduced on the nuclei. This is because the substrate resin or films are incapable of catalyzing the oxidation of reductant species (typically formaldehyde) that provide electrons for copper reduction reaction. In addition, homogeneous nucleation is kinetically hindered in solution phase by use of additives that slow down the reaction rate significantly to prevent spontaneous bath plate-out as electroless baths are thermodynamically unstable.

Because of factors such as relatively low available catalytic surface area, uneven dispersion of catalytic nanoclusters on the resin surface, poor catalytic activity due to nanocluster agglomerate size effects, amount of crystalline and amorphous catalyst phase, and unfavorable crystallographic orientation effects, copper seeding in the initiation step may be significantly hampered on certain substrate/composite resin materials. In case of poor catalyst coverage and reduced catalytic activity, the growth of copper may be stalled or stopped, which may result in discontinuities in copper film coverage. The described embodiments provide for increase of the number of copper nucleation sites, which in turn may help to initiate electroless copper deposition reaction by providing favorable catalytic sites (e.g., palladium).

Higher initial number of copper nucleation sites on a substrate surface may have substantial benefits. For example, in the process of copper deposition, copper nuclei may start growing initially from the palladium sites in all directions (3D growth). As deposition progresses, individual nuclei may coalesce into a continuous film, and the film may continue growing uniformly into the 2D growth phase. The uniformity of the electroless copper film may be related to the initiation phase that depends on factors described before including favorable catalytic sites for initial seeding. Typically, higher number of palladium sites may provide for faster coalescence of copper nuclei in the initiation phase and subsequent transition from 3D to 2D growth, resulting in improved thickness uniformity of the resulting plated copper film.

Figure 2:
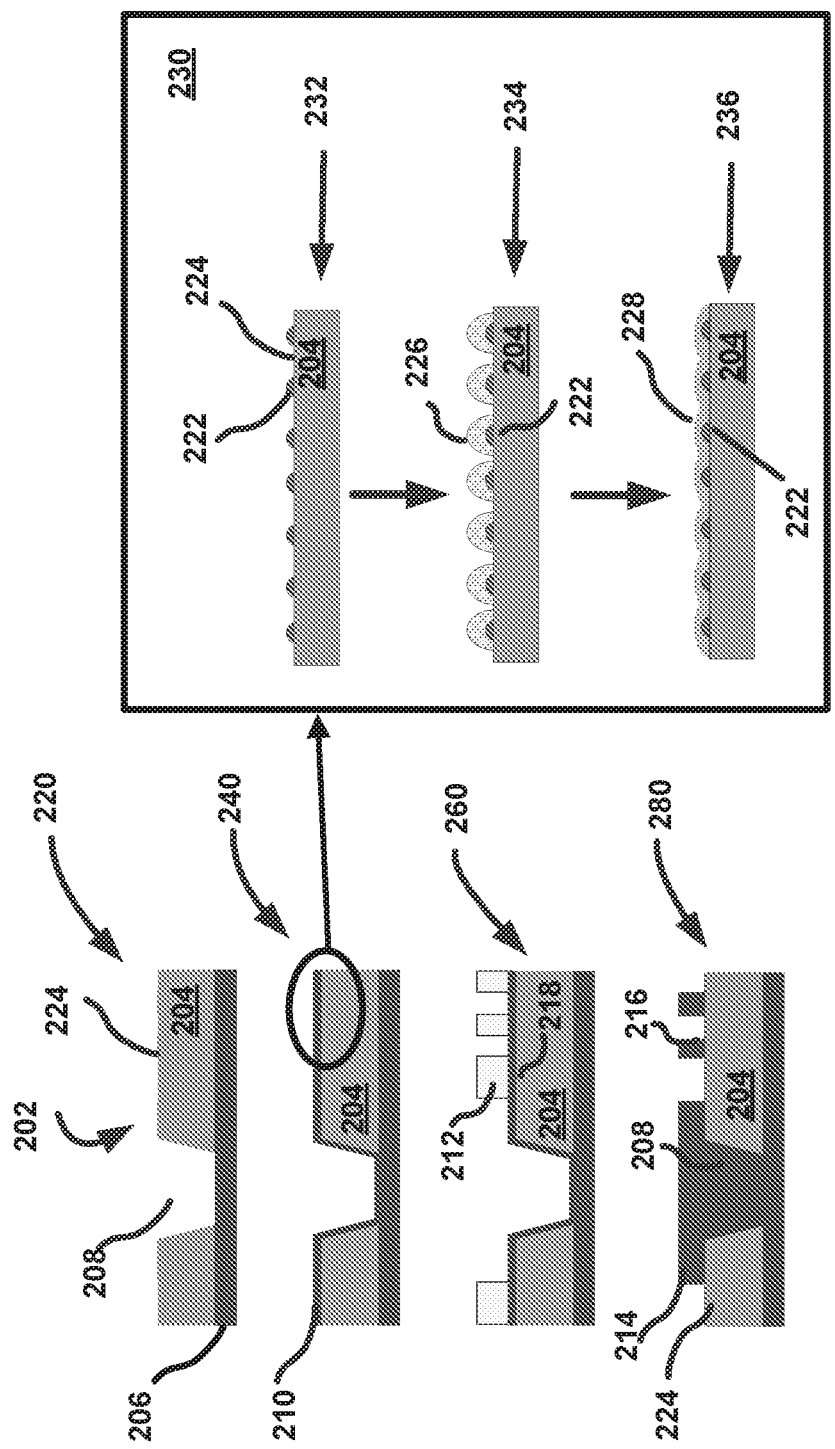
FIG. 2 illustrates an example cross-sectional view of a substrate of a semiconductor device at different process stages, in accordance with some embodiments.

The described embodiments provide a method to increase the number of catalytic sites on the substrate surface. Such number may be measured by a loading factor normalized to surface area (mg/dm2). The described embodiments may provide for catalytically favorable sites by means of cluster size effects, crystallographic orientation effects, crystallinity effects, or other means. The described embodiments involve using chemical functionalization principle, targeting nitrogen functional groups, with the goal of providing continuous copper films with uniform thickness. FIG. 2 illustrates an example cross-sectional view of a substrate of a semiconductor device at different process stages, in accordance with some embodiments. The process of FIG. 2 may be a part of the semi-additive process (SAP), which may be used for substrate packaging or PCB manufacturing. In general, the process of FIG. 2 may be applicable to any other process that may require a transition metal catalyst (e.g., palladium or other transition metal) deposition onto an organic surface of a substance, e.g. organic substrate. Typically, transition metal (palladium) seeding and electroless copper deposition may be used in the buildup of the dielectric layers of a substrate. Layers may be deposited repeatedly, and the process may be repeated multiple times, depending on the total number of metallization layers.

Stage 220 illustrates a substrate 202 comprising a dielectric (e.g., solder resist) layer 204 on top of a metal (e.g., copper) layer 206 after one or more vias 208 have been provided (e.g., drilled) in the substrate 202. The vias 208 may comprise blind micro-vias (BMV) and may be drilled in laminated and spin coated dielectric layer 204. The layer 204 may comprise, for example, inorganic fillers embedded in an organic polymer matrix.

Stage 240 illustrates the substrate 202 after the nitrogen or nitrogenous gas plasma treatment of a surface 224 of the substrate 202 has been performed. In embodiments, the plasma treatment may serve to activate the surface 224 for electroless plating of the dielectric/solder resist layer 204 by treating the surface with nitrogen gas plasma. The plasma treatment process may be applied multiple times before electroless plating.

The plasma treatment process may be conducted in a low pressure vacuum plasma chamber in which nitrogen gas (or other nitrogen containing gas) may be released and electric voltage may be applied to initiate plasma. In addition to nitrogen (or nitrogen containing) gas, the process may utilize other gases or mixture thereof to improve the process e.g. Ar, O2, etc. These gases may be used as part of a multi-step treatment process.

In embodiments, the plasma treatment process may be conducted in biased, unbiased, radio frequency (RF) or other type of plasma toolset with either single or batch unit capability. Such a toolset may be a stand-alone unit or may be manufactured to be integrated as part of the electroless plating toolset. Specialized plasma toolsets may utilize electrical biasing, RF, microwaves, electromagnetic induction, or the like to further enhance the plasma field density.

In general, the described embodiments of using the plasma treatment as a precursor to the electroless deposition process may be effected in a stand-alone toolset or physically integrated to be a part of an electroless toolset.

After the plasma treatment is performed, electroless plating may commence. As shown in stage 240, a metal (conductive seed) layer 210 may be formed on the surface 224 of the substrate 202. For example, the metal layer 210 may be formed with copper deposition on a palladium nucleus. A blown-up view 230 of the stage 240 depicts the process of electroless metal (e.g., copper) deposition on the surface 224 of the substrate 202 in different stages and will be described in detail in reference to FIG. 4.

Stage 260 illustrates the substrate 202 after a resist layer (film) 212 is deposited on top of the electroless conductive seed (metal) layer 210 and patterned. The resist layer 212 may be patterned, for example, by photolithography techniques to define surface 224 structures, such as BMV, pads, trace lines, etc.

Stage 280 illustrates the substrate 202 after electrolytic plating and mask removal. Electrolytic plating leverages the exposed conductive seed (metal) layer 210 to plate 214 the surface structures or features (e.g., via 208 or feature 216) as defined by the photolithography process. After the electrolytic plating (e.g., copper plating), the resist layer 212 and its underlying conductive seed layer (e.g., portion 218 in stage 260) may be removed.

Figure 3:
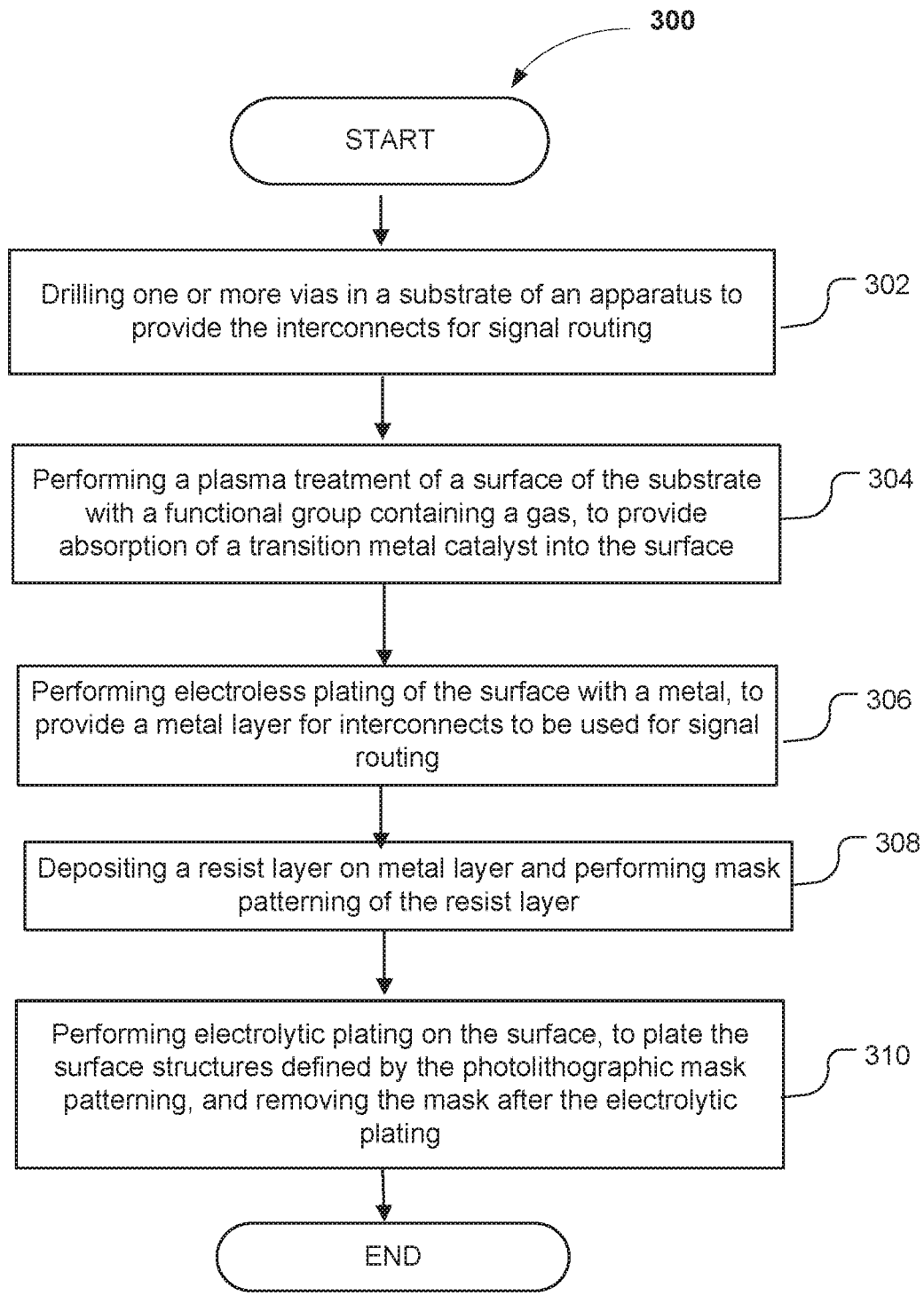
FIG. 3 is an example process flow diagram for provision of a substrate of a semiconductor device, in accordance with some embodiments.

FIG. 3 is a process flow diagram for provision of a substrate of a semiconductor device, in accordance with some embodiments. In embodiments, the semiconductor device may comprise a package, a PCB, or other semiconductor device using an organic substrate. The process 300 may comport with embodiments described in reference to FIG. 2. The actions described in the process 300 may occur in a different order or in parallel; the order provided below is for purposes of illustration and does not limit this disclosure.

The process 300 may begin at block 302 and include drilling one or more vias (e.g., BMV 208) in a substrate 204 of the device of FIG. 2 to provide the interconnects for signal routing.

At block 304, the process 300 may include performing a plasma treatment of the surface 224 of the substrate 204 with a functional group containing a gas, to enhance absorption of a transition metal catalyst into the surface. In embodiments, the gas may comprise a nitrogen or nitrogen containing gas.

At block 306, the process 300 may include performing electroless plating of the surface 224 with a metal layer (e.g., copper) 210, to provide a metal layer for interconnects to be used for signal routing. As described above, the transition metal catalyst (e.g., Pd) may serve to enhance electroless plating of the substrate surface.

At block 308, the process 300 may include depositing a resist layer 212 on the metal layer 210 and performing mask patterning of the resist layer 212.

At block 310, the process 300 may include performing electrolytic plating on the surface 224, to plate the surface structures defined by the photolithographic mask patterning, and removing the mask after the electrolytic plating.

Figure 4:
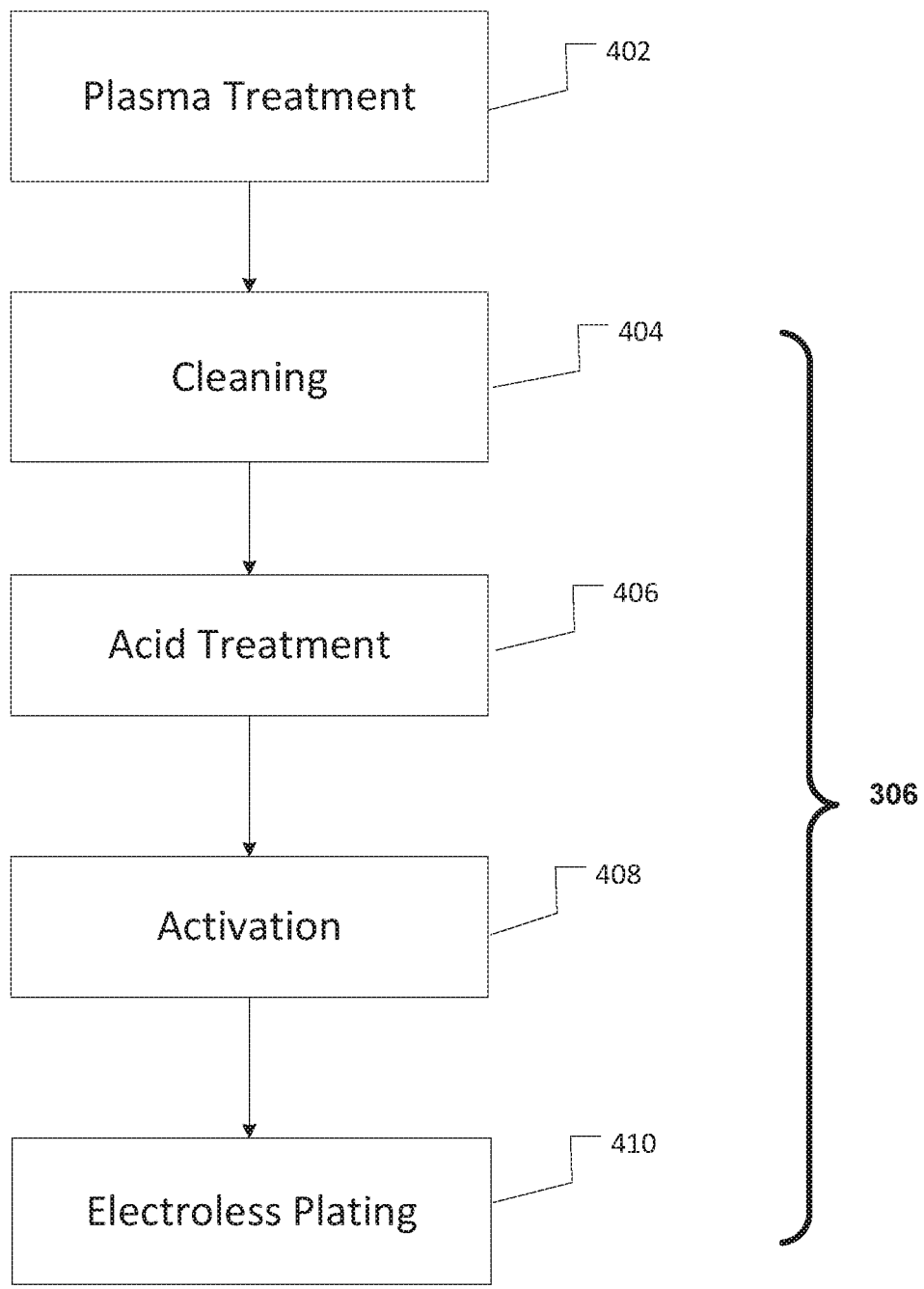
FIG. 4 is an example process flow diagram describing some aspects of the process of FIG. 3 in detail, in accordance with some embodiments.

FIG. 4 is an example process flow diagram describing some aspects of the process of FIG. 3 in detail, in accordance with some embodiments. More specifically, block 402 of FIG. 4 corresponds to block 304 of FIG. 3 (plasma treatment of an organic substrate), and blocks 404-410 corresponds to block 306 (electroless plating of the substrate with a metal, e.g., copper). Further, blocks 408-410 correspond to the blown-up view 230 of FIG. 2 that depicts the process of electroless metal (e.g., copper) deposition in different stages. Accordingly, the description of the process 400 is provided with reference to FIG. 2.

At block 402, the plasma treatment (e.g., nitrogen-based plasma treatment) of the surface of a substrate (e.g., surface 224 of the substrate 204 of FIG. 2) may be performed as described in reference to FIGS. 2-3.

At block 404, cleaning of the surface 224 of the dielectric substrate 204 may be performed in preparation for seeding.

At block 406, acid treatment of the surface may be used to etch of a thin layer of copper in the openings in the dielectric.

At block 408, activation, e.g., the process of absorbing palladium ions onto the dielectric surface and subsequently reducing them to metallic palladium may commence.

The process of activation may be enhanced by the plasma treatment process of block 402, compared to conventional solutions. As shown in stage 232 of view 230 (FIG. 2), the transition metal catalyst (e.g., Pd) may provide seed coverage (indicated by metal catalyst seeds 222) on a surface 224 of the dielectric film (substrate 204). This seed coverage may be improved by the plasma treatment of block 402, compared to conventional methods. In other words, there may be more transition metal catalyst seeds 222 on the surface 224, compared to conventional methods of seeding. At block 410, electroless plating, e.g., simultaneous reduction of copper ions and their deposition onto the substrate may commence. Stage 234 of the view 230 of FIG. 2 illustrates the initiation of the metal (e.g., copper) deposition (indicated by bumps 226) on the transition metal catalyst (Pd) seeds 222. Stage 236 of the view 230 illustrates the completion of the copper deposition process with copper growth 228 that may be larger than the growth resulted from conventional methods. It should be noted that copper growth may initiate on the Pd seeds; other transition catalyst metals may be used for growth of the metal layer 210 that may be other than copper.

Figure 5:
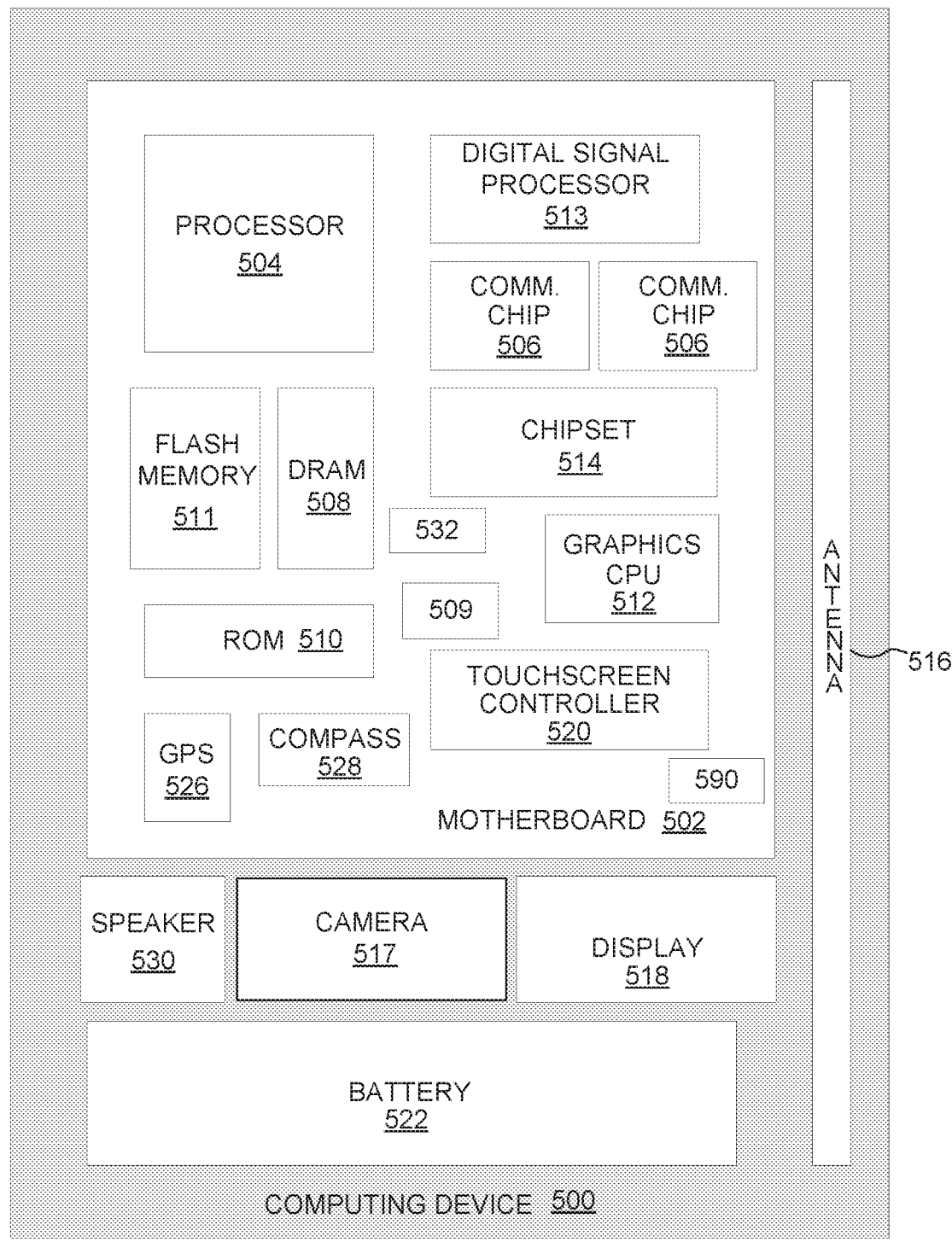
FIG. 5 illustrates an example computing device that may employ the apparatuses and/or methods described herein, according to various embodiments.

In summary, pre-treating the dielectric surface with nitrogenous gas based plasma may enhance the transition metal catalyst (e.g., Pd) seed coverage of the substrate surface, which in turn may increase the surface coverage with a metal layer to be used for signal routing in a semiconductor device. It should be noted that the plasma treatment process does not have an image by itself, and may manifest itself as an increased Pd seed coverage on the substrate surface, as illustrated by view 230 of FIG. 2. FIG. 5 illustrates an example computing device that may employ the apparatuses and/or methods described herein, according to various embodiments.

The motherboard 502 of the computing device 500 may include a number of components, including but not limited to a processor 504 and at least one communication chip 506. The processor 504 may be physically and electrically coupled to the motherboard 502. In some implementations, the communication chip 506 may also be physically and electrically coupled to the motherboard 502. In further implementations, the communication chip 505 may be part of the processor 504. In addition, the computing device 500 may further include an antenna 516.

Depending on its applications, the computing device 500 may include other components that may or may not be physically and electrically coupled to the motherboard 502. Some of these components are shown in FIG. 5 for purposes of explanation. These other components may include, but are not limited to, volatile memory (e.g., dynamic random-access memory (DRAM)) 508, static random access memory (SRAM) 509, non-volatile memory (e.g., read-only memory (ROM)) 510, flash memory 511, a graphics central processing unit (CPU) 512, a digital signal processor 513, a chipset 514, a display (e.g., a touchscreen display) 518, a touchscreen controller 520, a battery 522, an audio codec, a video codec, a power amplifier (not shown), a global positioning system (GPS) device 526, a compass 528, a Geiger counter, an accelerometer, a gyroscope (not shown), a speaker 530, a camera 517, and a mass storage device 532. These components may be included in IC packages, some of which may be disposed on 502.

In embodiments, at least some of the computing device 500 components, for example, the motherboard 502, communication chip 506, processor 504, digital signal processor 513, or memory 510/511 may be provided with a substrate provided with plasma treatment, in accordance with embodiments of FIGS. 2-4.

The communication chip 506 may enable wireless communications for the transfer of data to and from the computing device 500. The communication chip 505 may implement any of a number of wireless standards or protocols, including but not limited to Institute for Electrical and Electronic Engineers (IEEE) standards including Wi-Fi (IEEE 802.7 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards.

The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, EV-DO, and others.

In various implementations, the computing device 500 may be a server, a mobile computing device, a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The embodiments described herein may be further illustrated by the following examples.

Example 1 may be an apparatus, comprising: a substrate with a surface that comprises a metal layer to provide signal routing in the apparatus, wherein the metal layer is provided in response to a treatment of the surface with a gas containing a functional group, to provide absorption of a transition metal catalyst into the surface, and subsequent electroless plating of the surface with a metal, wherein the transition metal catalyst is to enhance electroless plating of the surface with the metal.

Example 2 may include the apparatus of example 1, wherein the substrate comprises a dielectric material, wherein the material includes one of: epoxy resin, surface finish film, molding compound, solder resist, or photo imageable dielectric.

Example 3 may include the apparatus of example 1, wherein the metal includes copper, wherein the treatment comprises a plasma treatment.

Example 4 may include the apparatus of example 1, wherein the functional group comprises a nitrogen gas or a gas that contains nitrogen.

Example 5 may include the apparatus of example 1, wherein the transition metal catalyst comprises an ionic or colloidal palladium.

Example 6 may include the apparatus of example 1, further comprising a die disposed on the substrate.

Example 7 may include the apparatus of example 6, wherein the apparatus further includes one or more vias arranged in the substrate, to provide the signal routing for signals generated by the die.

Example 8 may include the apparatus of any examples 1 to 7, wherein the apparatus comprises a semiconductor package.

Example 9 may include the apparatus of any examples 1 to 7, wherein the apparatus comprises a printed circuit board (PCB).

Example 10 may be a method, comprising: performing a treatment of a surface of a substrate of an electronic apparatus with a functional group containing a gas, to provide absorption of a transition metal catalyst into the surface; and conducting electroless plating of the surface with a metal, to provide a metal layer for interconnects to be used for signal routing in the apparatus, wherein the transition metal catalyst is to enhance electroless plating of the substrate surface.

Example 11 may include the method of example 10, further comprising: prior to performing the treatment, drilling one or more vias in the substrate, to provide the interconnects for signal routing.

Example 12 may include the method of example 10, further comprising: depositing a resist layer on top of the metal layer; and performing a photolithographic mask patterning of the resist layer, to define surface structures for the substrate of the apparatus.

Example 13 may include the method of example 12, further comprising: performing electrolytic plating on the surface, to plate the surface structures defined by the photolithographic mask patterning; and removing the resist film leftover after the electrolytic plating.

Example 14 may include the method of any examples 10 to 13, wherein the performing a treatment of a surface of a substrate includes treating the surface with a nitrogen gas or a gas containing nitrogen.

Example 15 may include the method of any examples 10 to 13, wherein the apparatus comprises one of: a semiconductor package or a printed circuit board (PCB).

Example 16 may be a computing device, comprising: a processor; and a memory coupled with the processor; wherein at least one of the processor or memory comprises an integrated circuit (IC), wherein the IC includes: a substrate with a surface that comprises a layer that contains a metal to provide signal routing for the IC, wherein the metal layer is provided in response to a plasma treatment of the surface with a gas containing a functional group, to provide absorption of a transition metal catalyst into the surface, and subsequent electroless plating of the surface with a metal, wherein the transition metal catalyst is to enhance electroless plating of the surface with the metal.

Example 17 may include the computing device of example 16, wherein the functional group comprises a nitrogen gas or a gas that contains nitrogen.

Example 18 may include the computing device of example 16, wherein the transition metal catalyst comprises a palladium.

Example 19 may include the computing device of example 16, wherein the substrate includes one or more vias arranged in the substrate, to provide the signal routing for signals generated by the processor.

Example 20 may include the computing device of any examples 16 to 19, wherein the at least one of the processor or memory is provided in a die, wherein the die is disposed on the substrate.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus, comprising:
a substrate with a surface that comprises a metal layer to provide signal routing in the apparatus, wherein the metal layer is provided in response to a treatment of the surface with a gas containing a functional group, to provide absorption of a transition metal catalyst into the surface, and subsequent electroless plating of the surface with a metal, wherein the transition metal catalyst is to enhance electroless plating of the surface with the metal, wherein, prior to the electroless plating, the transition metal catalyst comprises a plurality of seed protrusions disposed on the surface, wherein the metal layer comprises metal growth including a plurality of metal bumps deposited on the surface on top of the plurality of seeds such that the metal growth covers the plurality of seeds.

2. The apparatus of claim 1, wherein the substrate comprises a dielectric material, wherein the material includes one of: epoxy resin, surface finish film, molding compound, solder resist, or photo imageable dielectric.

3. The apparatus of claim 1, wherein the metal layer includes copper, wherein the treatment comprises a plasma treatment.

4. The apparatus of claim 1, wherein the functional group comprises a nitrogen gas or a gas that contains nitrogen.

5. The apparatus of claim 1, wherein the transition metal catalyst comprises an ionic or colloidal palladium.

6. The apparatus of claim 1, further comprising a die disposed on the substrate.

7. The apparatus of claim 6, wherein the apparatus further includes one or more vias arranged in the substrate, to provide the signal routing for signals generated by the die.

8. The apparatus of claim 1, wherein the apparatus comprises a semiconductor package.

9. The apparatus of claim 1, wherein the apparatus comprises a printed circuit board (PCB).

10. A computing device, comprising: a processor; and a memory coupled with the processor; wherein at least one of the processor or memory comprises an integrated circuit (IC), wherein the IC includes: a substrate with a surface that comprises a layer that contains a metal to provide signal routing for the IC, wherein the metal layer is provided in response to a plasma treatment of the surface with a gas containing a functional group, to provide absorption of a transition metal catalyst into the surface, and subsequent electroless plating of the surface with a metal, wherein the transition metal catalyst is to enhance electroless plating of the surface with the metal, wherein, prior to the electroless plating, the transition metal catalyst comprises a plurality of seed protrusions disposed on the surface, wherein the metal layer comprises metal growth including a plurality of metal bumps deposited on the surface on top of the plurality of seeds such that the metal growth covers the plurality of seeds.

11. The computing device of claim 10, wherein the functional group comprises a nitrogen gas or a gas that contains nitrogen.

12. The computing device of claim 10, wherein the transition metal catalyst comprises a palladium.

13. The computing device of claim 10, wherein the substrate includes one or more vias arranged in the substrate, to provide the signal routing for signals generated by the processor.

14. The computing device of claim 10, wherein the at least one of the processor or memory is provided in a die, wherein the die is disposed on the substrate.

* * * * *